US011961786B2

(12) United States Patent
Tani

(10) Patent No.: US 11,961,786 B2
(45) Date of Patent: Apr. 16, 2024

(54) SEMICONDUCTOR POWER MODULE

(71) Applicant: Mitsubishi Electric Corporation, Tokyo (JP)

(72) Inventor: Masakazu Tani, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 420 days.

(21) Appl. No.: 17/464,859

(22) Filed: Sep. 2, 2021

(65) Prior Publication Data

US 2022/0285246 A1 Sep. 8, 2022

(30) Foreign Application Priority Data

Mar. 2, 2021 (JP) ................................. 2021-032242

(51) Int. Cl.
*H01L 23/473* (2006.01)
(52) U.S. Cl.
CPC .................................. *H01L 23/473* (2013.01)
(58) Field of Classification Search
CPC .............. H01L 23/473; H01L 23/3735; H01L 23/4093; H01L 23/4334; H01L 23/49562; H01L 23/10; H01L 23/367; H05K 1/0203
See application file for complete search history.

(56) References Cited

U.S. PATENT DOCUMENTS

| 2009/0040724 | A1 | 2/2009 | Nishikimi et al. | |
|---|---|---|---|---|
| 2012/0039039 | A1 | 2/2012 | Nishikimi et al. | |
| 2012/0170217 | A1 | 7/2012 | Nishikimi et al. | |
| 2014/0016387 | A1 | 1/2014 | Nishikimi et al. | |
| 2015/0055386 | A1 | 2/2015 | Nishikimi et al. | |
| 2020/0357717 | A1* | 11/2020 | Maier | H01L 25/115 |
| 2020/0357719 | A1* | 11/2020 | Nakagawa | H01L 24/48 |

FOREIGN PATENT DOCUMENTS

JP 5698310 B2 4/2015

* cited by examiner

*Primary Examiner* — Marc Anthony Armand
(74) *Attorney, Agent, or Firm* — Sughrue Mion, PLLC; Richard C. Turner

(57) ABSTRACT

A semiconductor power module is configured in such a way that a protruding portion of a heat sink is inserted into a penetration hole of a jacket, that an end face portion of the protruding portion and a cooling fin are exposed in a flow path, that a front-end portion of the cooling fin abuts on an inner wall surface of the flow path, that a packing is mounted in a groove portion formed between an inner wall portion of the penetration hole and a side wall portion, of the protruding portion of the heat sink, that faces the inner wall portion, that the inner wall portion of the penetration hole and the side wall portion of the protruding portion press the packing in the radial direction thereof, that a spring member presses the front-end portion of the cooling fin to the inner wall surface of the flow path.

18 Claims, 6 Drawing Sheets

SEMICONDUCTOR POWER MODULE

BACKGROUND OF THE INVENTION

Field of the Invention

The present disclosure relates to a semiconductor power module.

Description of the Related Art

As is well known, an electric-power conversion apparatus mounted in a vehicle such as a hybrid automobile or an electric automobile converts DC electric power from a vehicle battery into AC electric power and then supplies the AC electric power to an electric rotating machine, when the electric rotating machine mounted in the vehicle is operated as a motor for driving the vehicle; the electric-power conversion apparatus converts AC electric power generated by the electric rotating machine into DC electric power and then supplies the DC electric power to the vehicle battery, when the foregoing electric rotating machine is generating electric power through regenerative operation.

The foregoing electric-power conversion apparatus is configured, for example, with a bridge circuit; the DC terminals of the bridge circuit are connected with a vehicle battery, and the AC terminals thereof are connected with stator windings of an electric rotating machine. In each of an upper arm and a lower arm included in the electric-power conversion apparatus, semiconductor switching devices are connected with each other; switching operation of each of these semiconductor switching devices is controlled based on a command from an ECU (Electronic Control Unit), so that electric-power conversion operation by the electric-power conversion apparatus is controlled.

The foregoing semiconductor switching device is configured, for example, with a power semiconductor device such as a MOS-FET (Metal Oxide Semiconductor Field Effect Transistor); in general, the power semiconductor device is contained in a semiconductor power module. Because a power semiconductor device generates heat due to its switching operation, a semiconductor power module is provided with a cooling means such as a heat sink for cooling the power semiconductor device.

For example, Patent Document 1 discloses an electric-power conversion apparatus in which a fin is provided on the metal base of a semiconductor power module, the fin is exposed in the flow path of a water jacket, coolant water flowing in the flow path cools the semiconductor power module through the intermediary of the fin. A conventional semiconductor power module utilized in the electric-power conversion apparatus disclosed in Patent Document 1 is configured to be fixed to the case of the water jacket with a screw; a ring-shaped packing inserted between the semiconductor power module and the water jacket is compressed in the direction of tightening with the screw, so that liquid-tightness between the semiconductor power module and the flow path of the water jacket is secured.

PRIOR ART REFERENCE

Patent Literature

[Patent Document 1] Japanese Patent No. 5698310

SUMMARY OF THE INVENTION

A conventional semiconductor power module is configured in such a way that a packing inserted between a water jacket and itself is compressed in the direction of tightening with the screw so that liquid-tightness is secured; thus, it is required that the semiconductor power module is provided with a bush material for fixing the screw, which hinders the semiconductor power module from being downsized. Moreover, because a conventional semiconductor power module is mounted on the case of a water jacket by inserting a packing between the base surface of a heat sink for the semiconductor power module and the surface of the case of the water jacket, a gap is caused between the front end of a fin for the semiconductor power module and the bottom surface of the flow path of the water jacket; thus, unevenness occurs in cooling performance and hence the cooling performance may be deteriorated.

The present disclosure is to disclose a technology for solving the foregoing problem; an objective thereof is to provide a semiconductor power module that realizes downsizing and improvement of the cooling performance.

A semiconductor power module disclosed in the present disclosure is mounted on a front side of a case of a jacket provided with a flow path through which cooling fluid flows and is cooled by the cooling fluid; the semiconductor power module includes a semiconductor device forming a switching circuit, a first electrode to which the semiconductor device is die-bonded, a second electrode connected with the semiconductor device, a heat sink whose front side is bonded to the second electrode through the intermediary of an insulating material, and a transfer resin in which the semiconductor device, the first electrode, the second electrode, and the insulating material are embedded. The semiconductor power module is configured in such away that the heat sink has a protruding portion that is exposed from and protrudes from part of a rear side of the transfer resin and a cooling fin fixed to an endface portion of the protruding portion, that the case of the jacket has a penetration hole that penetrates a portion thereof between the flow path and the front side of said case, that when the semiconductor power module is mounted on the case of the jacket, the protruding portion of the heat sink is inserted into the penetration hole in the case, and the endface portion of the protruding portion and the cooling fin are exposed in the flow path, that the front-end portion of the cooling fin abuts on the inner wall surface of the flow path, that a ring-shaped packing is inserted into a groove portion formed between a side wall portion of the protruding portion of the heat sink and an inner wall portion of the penetration hole of the jacket or a side wall portion of the case, that the inner wall portion of the penetration hole or the side wall portion of the case and the side wall portion of the protruding portion compress the ring-shaped packing in a radial direction of the ring-shaped packing, and that elastic force of a spring member presses the front-end portion of the cooling fin to the inner wall surface of the flow path.

The present disclosure makes it possible to obtain a semiconductor power module that realizes downsizing of a power module and improvement of the cooling performance.

The foregoing and other object, features, aspects, and advantages of the present invention will become more

DETAILED DESCRIPTION OF THE PREFERRED EMBODIMENTS

A semiconductor power module according to the present disclosure is utilized as a constituent element in an electric-power conversion apparatus to be mounted in an electric vehicle such as a hybrid automobile or an electric automobile. An electric-power conversion apparatus signifies an apparatus having a switching circuit for controlling electric power; electric-power conversion apparatuses according to the present disclosure correspond to electric power components such as a motor driving inverter mounted in an electric vehicle such as a hybrid automobile or an electric automobile, a step-down converter for converting a high voltage into a low voltage, and an electric charger that is connected with an external power supply apparatus so as to charge a vehicle battery.

Hereinafter, each of semiconductor power modules according to Embodiments of the present disclosure will be explained as a semiconductor power module utilized in an electric-power conversion apparatus to be mounted in an electric vehicle; however, it goes without saying that any one of semiconductor power modules according to the present disclosure is not limited to the one that is utilized in an electric-power conversion apparatus to be mounted in an electric vehicle.

Figure 11:
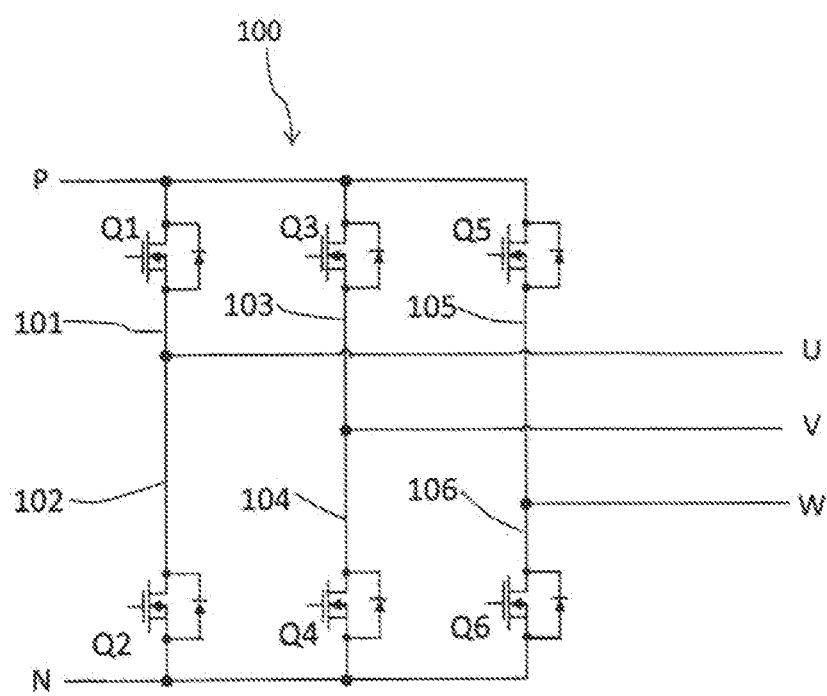
FIG. 11 is a circuit diagram of an electric-power conversion apparatus.

At first, there will be explained a circuit configuration of an electric-power conversion apparatus in which a semiconductor power module according to Embodiment of the present disclosure is utilized. FIG. 11 is a circuit diagram of an electric-power conversion apparatus, which is configured as an electric-power conversion apparatus that performs electric-power conversion between an electric rotating machine (unillustrated) to be mounted in an electric vehicle and a vehicle battery (unillustrated); FIG. 11 represents only principal parts of the electric-power conversion apparatus. In FIG. 11, an electric-power conversion apparatus 100 mainly includes a three-phase bridge circuit; a positive terminal P and a negative terminal N at the DC side thereof are connected with the positive electrode and the negative electrode, respectively, of a vehicle battery. A U-phase terminal U, a V-phase terminal V, and a W-phase terminal W at the AC side are connected with a U-phase winding terminal, a V-phase winding terminal, and a W-phase winding terminal (none of them is illustrated), respectively, of the three-phase armature winding in the electric rotating machine.

Switching circuits Q1, Q3, and Q5 are connected with a U-phase upper arm 101, a V-phase upper arm 103, and a W-phase upper arm 105 of the electric-power conversion apparatus 100; switching circuits Q2, Q4, and Q6 are connected with a U-phase lower arm 102, a V-phase lower arm 104, and a W-phase lower arm 106. The U-phase upper arm 101 and the U-phase lower arm 102 are connected in series with each other; the series connection portion therebetween is connected with the U-phase terminal U. The V-phase upper arm 103 and the V-phase lower arm 104 are connected in series with each other; the series connection portion therebetween is connected with the V-phase terminal V. The W-phase upper arm 105 and the W-phase lower arm 106 are connected in series with each other; the series connection portion therebetween is connected with the W-phase terminal W.

Each of the switching circuits Q1, Q2, Q3, Q4, Q5, and Q6 is formed of semiconductor devices including a semiconductor switching device such as a MOS-FET (Metal Oxide Semiconductor Field Effect Transistor) or an IGBT (Insulated Gate Bipolar Transistor) and a reverse-flow prevention diode connected in parallel with the semiconductor switching device. As the base material of each of the switching circuits Q1, Q2, Q3, Q4, Q5, and Q6, silicon and a next-generation semiconductor such as a silicon carbide or a gallium nitride are utilized.

An ECU (Electronic Control Unit) (unillustrated) mounted in the electric vehicle controls the switching circuits Q1, Q2, Q3, Q4, Q5, and Q6, so that the electric-power conversion apparatus 100 configured as described above operates as an inverter that converts DC electric power from the vehicle battery into AC electric power and then supplies the AC electric power to the electric rotating machine or operates as a converter that converts AC electric power generated by the electric rotating machine into DC electric power and then supplies the DC electric power to the vehicle battery.

A semiconductor power module according to the present disclosure is separately configured, for example, in units of an arm including an upper arm and a lower arm for each of the phases of the electric-power conversion apparatus 100. In other words, as the respective separate semiconductor power modules, there are configured a U-phase semiconductor power module containing the switching circuit Q1 of the U-phase upper arm 101 and the switching circuit Q2 of the U-phase lower arm 102, a V-phase semiconductor power module containing the switching circuit Q3 of the V-phase upper arm 103 and the switching circuit Q4 of the V-phase lower arm 104, and a W-phase semiconductor power module containing the switching circuit Q5 of the W-phase upper arm 105 and the switching circuit Q6 of the W-phase lower arm 106. The configuration of a semiconductor power module according to the present disclosure is not limited to the foregoing configuration; the configuration may be made in units of a single switching circuit or in such a way as to contain all of the switching circuits.

The foregoing U-phase semiconductor power module, V-phase semiconductor power module, and W-phase semiconductor power module each have one and the same configuration; in the following explanation, they will simply be explained, as a semiconductor power module.

Because a switching circuit generates heat due to its switching operation, a semiconductor power module according to the present disclosure is configured integrally with a heat sink for cooling a semiconductor device included in the switching circuit. Two or more cooling fins are provided on the endface of the heat sink; when the semiconductor power module is mounted on the case of a jacket having a flow path through which a cooling fluid flows, the endface of the heat sink and the cooling fins are exposed in the flow path of the jacket. In the following explanation, there will be explained the case where the semiconductor power module is mounted on the case of a jacket utilizing water as a cooling fluid; however, the cooling fluid is not limited to water.

Hereinafter, respective semiconductor power modules according to Embodiments 1 through 9 will be explained in detail, based on the drawings. In each of the drawings, the same reference characters denote the same or similar portions.

Embodiment 1

Figure 1:
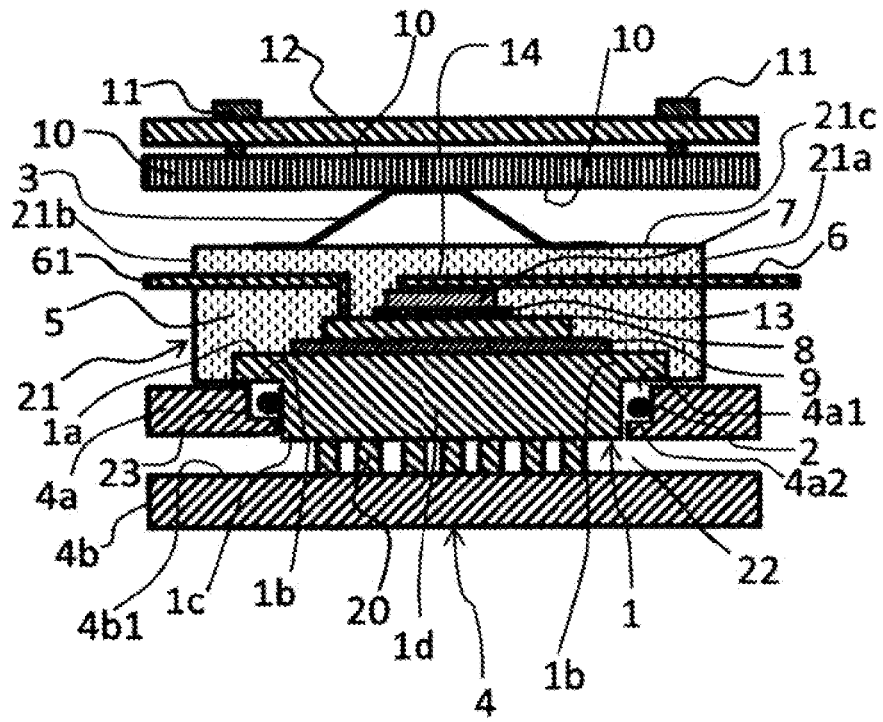
FIG. 1 is a cross-sectional view illustrating a semiconductor power module according to Embodiment 1, when mounted on a water jacket.

FIG. 1 is a cross-sectional view illustrating a semiconductor power module according to Embodiment 1, when mounted on a water jacket.

In FIG. 1, as described above, a semiconductor power module 21 is configured in units of an arm for each of the three phases; a semiconductor device 7 included in a switching circuit, a first electrode 8, a second electrode 6, a bus bar 61, and a heat sink 1 are integrally fixed with one another in such a way as to be embedded in a transfer resin 5. As described later, part of each of the second electrode 6, the bus bar 61, and the heat sink 1 is exposed from the transfer resin 5.

The rear side of the semiconductor device 7 is die-bonded to the first electrode 8 with a second bonding material 13, for example, solder. The front side of the semiconductor device 7 is bonded to the second electrode 6 with a first bonding material 14, for example, solder. It may be allowed that the front side of the semiconductor device 7 and the second electrode 6 are connected with each other through wire bonding, instead of the first bonding material 14.

Part of the second electrode 6 is embedded in the transfer resin 5; the part other than the embedded part thereof is pulled out from a first side-surface portion 21*a* of the semiconductor power module 21. Part of the bus bar 61 is embedded in the transfer resin 5; the part other than the embedded part thereof is pulled out from a second side-surface portion 21*b* of the semiconductor power module 21. The first side-surface portion 21*a* and the second side-surface portion 21*b* of the semiconductor power module 21 exist in such a way as to face each other; the second electrode 6 and the bus bar 61 are pulled out from the semiconductor power module 21 in respective opposite directions.

The first electrode 8 is bonded to a front side 1*a* of the heat sink 1 with an insulation sheet 9, as an insulating material. The insulation sheet 9 is formed by making resin having insulating performance contain ceramic filler. The heat sink 1 is provided with a protruding portion 1*d* that is exposed from and protrudes from part of the rear side of the transfer resin 5. The protruding portion 1*d* of the heat sink 1 protrudes from a ring-shaped step portion 1*b* formed in the heat sink 1.

Two or more cooling fins 20 are fixed to an endface portion 1*c* of the protruding portion 1*d* of the heat sink 1; the cooling fins 20 protrude from the endface portion 1*c* of the heat sink 1 and then extend downward in the drawing.

The heat sink 1 is embedded in the transfer resin 5 in such a way that the step portion 1*b* and the protruding portion 1*d* thereof are exposed from the rear side of the transfer resin 5. The step portion 1*b* of the heat sink 1 is formed in such a way as to have a plane the same as that of the bottom-surface portion of the transfer resin 5. The semiconductor power module 21 according to Embodiment 1, configured in such a manner as described above, is mounted on a water jacket 4, as a cooling-means jacket.

Between a first case 4*a* and a second case 4*b*, the water jacket 4 has a flow path 22 through which coolant water as cooling fluid flows. The first case 4*a* is provided with a penetration hole 4*a*1 that penetrates a portion thereof between the flow path 22 and the front side of the first case 4*a*. A ring-shaped step portion 4*a*2 is provided in the penetration hole 4*a*1. The first case 4*a* and the second case 4*b* of the water jacket 4 may be integrally formed with the same metal material or an insulator such as resin; alternatively, the first case 4*a* and the second case 4*b*, which are formed separately, may be combined into one body.

The semiconductor power module 21 is disposed in such a way that when it is mounted on the surface of the first case 4*a* of the water jacket 4, the step portion 1*b* of the heat sink 1 faces the front side of the first case 4*a* of the water jacket 4 and the endface portion 1*c* of the protruding portion 1*d* of the heat sink 1 and the two or more cooling fins 20 are exposed in the flow path 22 of the water jacket 4. In this situation, the front-end portions of the two or more cooling fins 20 of the heat sink 1 abut on an inner wall surface 4*b*1 of the flow path 22 of the water jacket 4; however, because a gap is still formed between the front side of the first case 4*a* of the water jacket 4 and the rear side of the semiconductor power module 21 and between the front side of the first case 4*a* of the water jacket 4 and the step portion 1*b* of the heat sink 1, the semiconductor power module 21 can move toward the first case 4*a* of the water jacket 4 by a distance corresponding to the distance of the gap.

As described later, a spring member 3 presses the semiconductor power module 21 toward the water jacket 4; thus, even when due to production tolerance, there exists unevenness in the height dimension of the cooling fin 20, the front-end portions of the cooling fins 20 can securely be made to abut on the inner wall surface 4*b*1 of the flow path 22.

A ring-shaped packing 2 is mounted in a groove portion 23 formed by the inner wall portion of the penetration hole 4*a*1 provided in the first case 4*a* of the water jacket 4 and by the side wall portion of the protruding portion 1*d* of the heat sink 1. More specifically, the ring-shaped packing 2 is mounted in the groove portion 23 formed by being surrounded by the step portion 1*b* of the heat sink 1 and the step portion 4*a*2 of the first case 4*a* of the water jacket 4. In addition, the ring-shaped packing 2 may have any one of the shapes of a circle, an ellipse, and a rectangle.

The inner wall portion of the penetration hole 4a1 and the side wall portion of the protruding portion 1d of the heat sink 1 compress the ring-shaped packing 2 in the radial direction of the ring-shaped packing 2, so that the liquid-tightness between the heat sink 1 and the first case 4a of the water jacket 4 can be secured. In the present embodiment, the radial direction of the ring-shaped packing 2 signifies at least one of a direction heading from the radial-direction inside of the ring-shaped packing 2 toward the radial-direction outside thereof and a direction heading from the radial-direction outside of the ring-shaped packing 2 toward the radial-direction inside thereof.

The ring-shaped packing 2 is formed in such a way that the cross section thereof is round-shaped or H-shaped and is pressed and compressed in the radial direction thereof by the step portion 1b of the heat sink 1 and the step portion 4a2 of the first case 4a of the water jacket 4, so that the foregoing liquid-tightness is secured.

When coolant water is made to flow through the flow path 22, the water pressure of the coolant water exerts force on the heat sink 1; the force makes the heat sink 1 float toward the anti-flow-path side. Accordingly, in order to prevent the heat sink 1 from floating, the spring member 3 formed of a leaf spring is provided. The spring member 3 is mounted between a front side 21c of the transfer resin 5 of the semiconductor power module 21 and the rear side of a supporting member 10; when pressed toward the water jacket 4 by the supporting member 10, the spring member 3 is deformed; then, elastic force caused by the deformation of the spring member 3 constantly presses the semiconductor power module 21 toward the water jacket 4. It may be allowed that the spring member 3 is formed of a plate spring, a spring formed in the shape of a spiral, or the like, instead of the leaf spring.

The supporting member 10 has a function in which in order to raise the vibration resistance of the control board 12, the control board 12 is fixed thereto by screws 11; as described above, the supporting member 10 also has a function of pressing the spring member 3 to the semiconductor power module 21. A control circuit and the like for controlling the switching circuits of the semiconductor power module 21 are mounted on the control board 12. The supporting member 10 and the water jacket 4 are fixed to each other by a fixing member (unillustrated) or the like.

The semiconductor power module, according to Embodiment 1, configured in such a manner as described above, can demonstrate the effects described below.

When a conventional semiconductor power module is mounted on the case of a water jacket, a ring-shaped packing is inserted between the front side of the water jacket and the rear side of the semiconductor power module and then the semiconductor power module is screwed and fixed to the case of the water jacket. In this situation, because the ring-shaped packing is compressed in the screwing direction, the liquid-tightness between the semiconductor power module and the water jacket is secured. Thus, because the conventional semiconductor power module requires a bush material for mounting the screw, the semiconductor power module is upsized.

In contrast to such a conventional semiconductor power module, in the semiconductor power module according to Embodiment 1 of the present disclosure, the ring-shaped packing 2 is mounted in the groove portion 23 formed by the heat sink 1 and the water jacket 4; the inner wall portion of the penetration hole 4a1 of the water jacket 4 and the side wall portion of the protruding portion 1d compress the ring-shaped packing 2 in the radial direction of the ring-shaped packing 2, so that the liquid-tightness between the semiconductor power module 21 and the water jacket 4 is secured; in addition, the semiconductor power module 21 is pressed toward the water jacket by the spring member 3, so that it is made possible to prevent the semiconductor power module 21 from floating due to a water pressure and hence the bush material for mounting the screw is not required. Thus, downsizing of the semiconductor power module can be realized.

Moreover, in the conventional semiconductor power module, the ring-shaped packing is compressed by the rear side of the heat sink exposed at the rear side of the semiconductor power module and the front side of the case of the water jacket. As a result, due to unevenness, caused by production tolerance and the like, in the height dimension of the cooling fin fixed to the rear side of the heat sink, a gap is formed between the front-end portion of the cooling fin 20 of the heat sink 1 and the inner wall surface of the flow path of the water jacket 4 and the coolant water flows into the gap; therefore, the cooling performance is significantly deteriorated. Moreover, when in order to raise the cooling performance, the pitch of the two or more cooling fins is shortened, the fluid resistance of the cooling fins increases and hence a large quantity of water flows into the gaps between the front-end portions of the cooling fins and the inner wall surface of the flow path; therefore, it is difficult to raise the cooling performance of the cooling fins.

In contrast, in the semiconductor power module according to Embodiment 1 of the present disclosure, a gap is formed between the front side of the first case 4a of the water jacket 4 and the rear side of the semiconductor power module 21 and between the front side of the first case 4a of the water jacket 4 and the step portion 1b, of the heat sink 1, that is exposed from the foregoing rear side, and the semiconductor power module 21 can be moved by the elastic force of the spring member 3 toward the water jacket 4 by the distance of the foregoing gap. Accordingly, even when due to production tolerance, there exists unevenness in the height dimension of the cooling fin 20, the front-end portions of the cooling fins 20 can securely be made to abut on the inner wall surface 4b1 of the flow path 22. As a result, there exists no gap between the front-end portion of the cooling fin 20 and the inner wall surface 4b1 of the flow path 22 of the water jacket 4; thus, it is made possible that the cooling performance is prevented from being deteriorated and that the cooling performance is raised by shortening the pitch of the two or more cooling fins 20.

Embodiment 2

Figure 2:
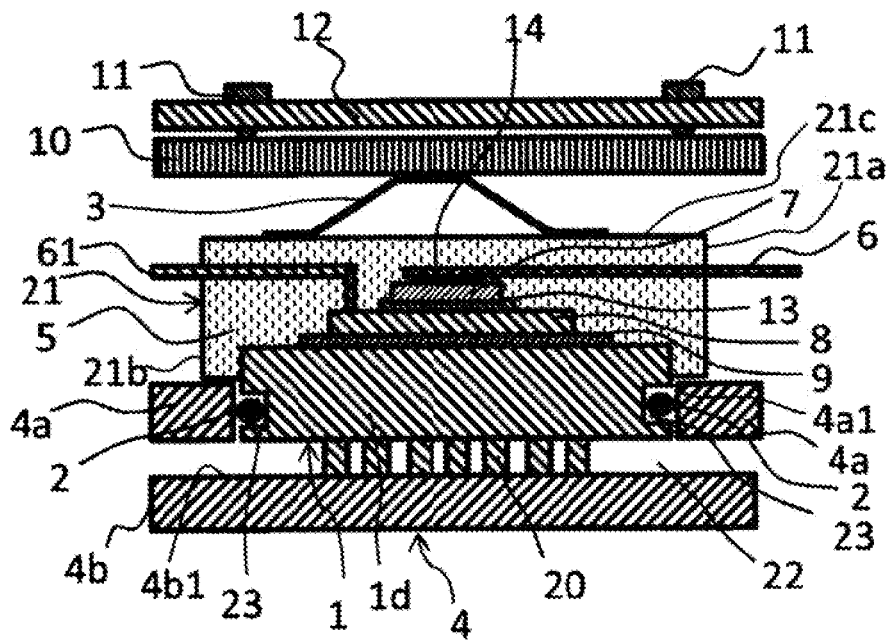
FIG. 2 is a cross-sectional view illustrating a semiconductor power module according to Embodiment 2, when mounted on a water jacket.

FIG. 2 is a cross-sectional view illustrating a semiconductor power module according to Embodiment 2, when mounted on a water jacket. In FIG. 2, a heat sink 1 has a groove portion 23 formed of a ring-shaped U-shaped groove in the side wall portion thereof. The ring-shaped packing 2 is mounted in the groove portion 23. The semiconductor power module 21 is mounted on the water jacket 4; the inner wall portion of the penetration hole 4a1 formed in the first case 4a of the water jacket 4 and the side wall portion of the protruding portion 1d of the heat sink 1 compress the ring-shaped packing 2 in the in the radial direction thereof; as a result the liquid-tightness, i.e., the sealing performance is secured. The other configurations are the same as those of the semiconductor power module according to Embodiment 1.

In addition to an effect the same as that of the semiconductor power module according to Embodiment 1, the semiconductor power module according to Embodiment 2 makes it possible to demonstrate an effect that positioning of the ring-shaped packing 2 is facilitated and hence the working efficiency is high.

Embodiment 3

Figure 3:
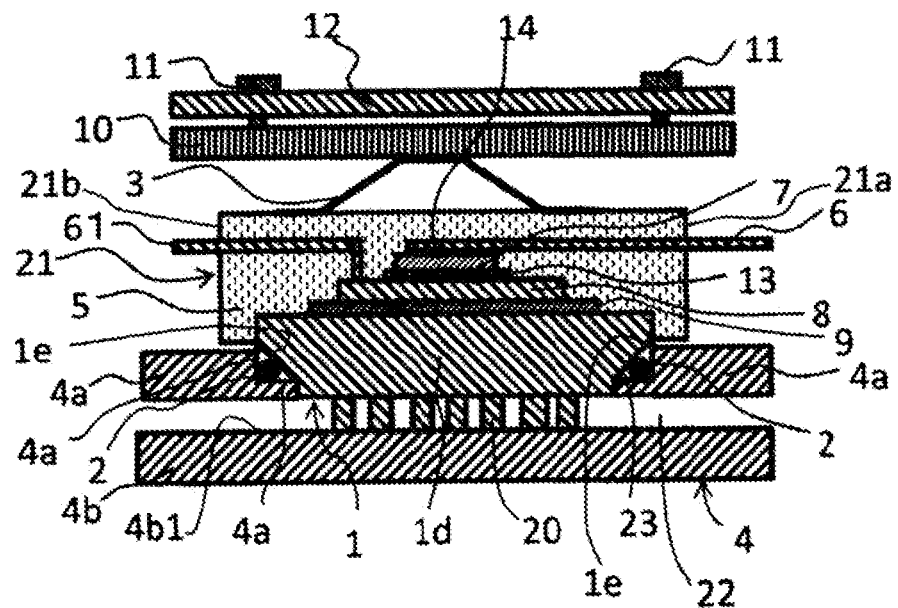
FIG. 3 is a cross-sectional view illustrating a semiconductor power module according to Embodiment 3, when mounted on a water jacket.

FIG. 3 is a cross-sectional view illustrating a semiconductor power module according to Embodiment 3, when mounted on a water jacket. In FIG. 3, a protruding portion 1*d* of a heat sink 1 has a slant surface portion 1*e* formed in such a way that the outer-diameter dimension thereof gradually decreases from the rear side of the transfer resin 5 toward the water jacket 4. The ring-shaped packing 2 is mounted in a groove portion 23 formed of the slant surface portion 1*e* of the protruding portion 1*d* of the heat sink 1 and the inner wall portion of the penetration hole 4*a*1 of the water jacket 4. The other configurations are the same as those of the semiconductor power module according to Embodiment 1.

The semiconductor power module according to Embodiment 3 can demonstrate an effect the same as that of the semiconductor power module according to Embodiment 1.

Embodiment 4

Figure 4:
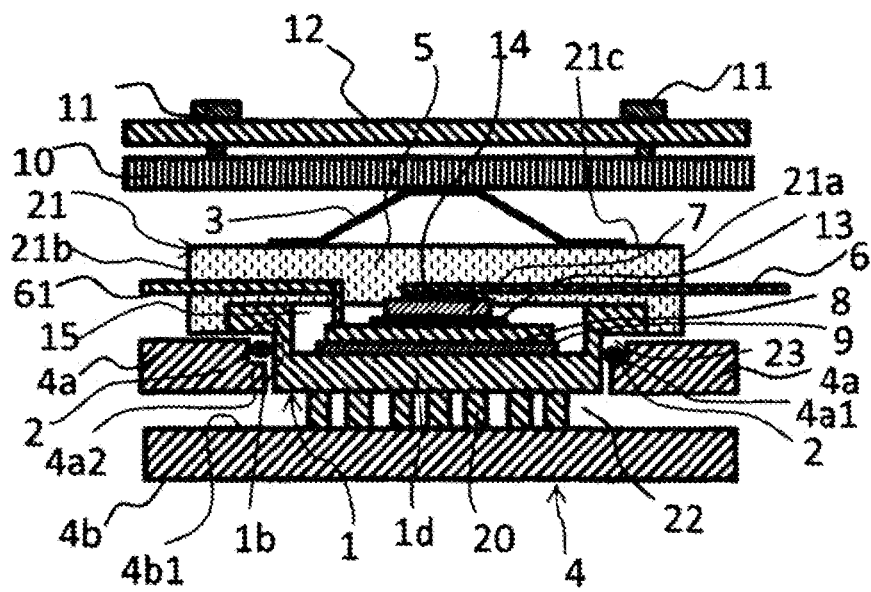
FIG. 4 is a cross-sectional view illustrating a semiconductor power module according to Embodiment 4, when mounted on a water jacket.

FIG. 4 is a cross-sectional view illustrating a semiconductor power module according to Embodiment 4, when mounted on a water jacket. In FIG. 4, a heat sink 1 has a concavity portion 15 that is dented from the front side thereof toward the inside thereof. The semiconductor device 7, the first electrode 8, and the insulation sheet 9 are placed in the concavity portion 15 of the heat sink 1. Although not illustrated, the transfer resin 5 is filled also into the concavity portion 15. The other configurations are the same as those of the semiconductor power module according to Embodiment 1.

In addition to an effect the same as that of the semiconductor power module according to Embodiment 1, the semiconductor power module according to Embodiment 4 makes it possible to shorten the heat transport distance between the semiconductor device 7 and the cooling fin 20 of the heat sink 1; thus, the cooling performance can be raised.

Embodiment 5

Figure 5:
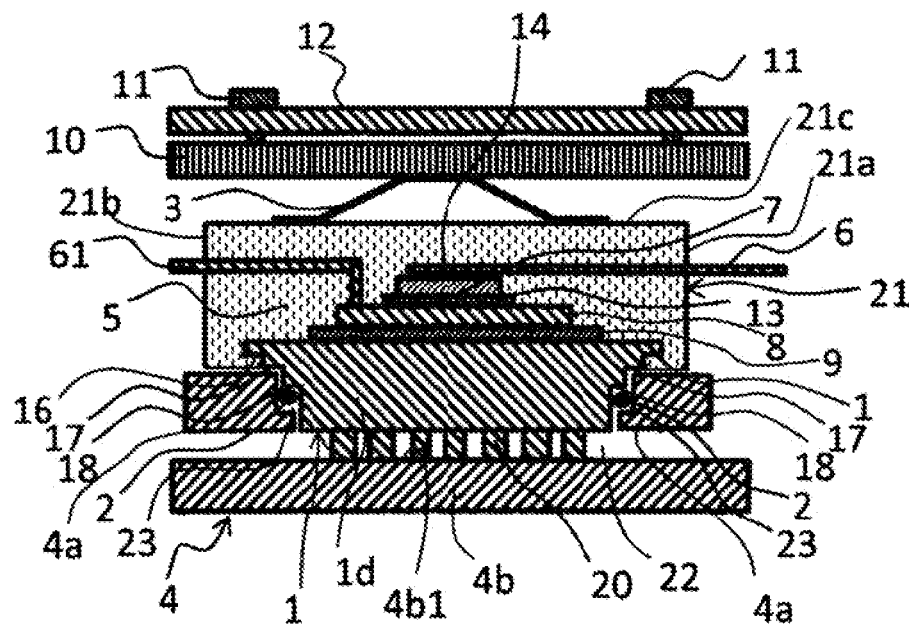
FIG. 5 is a cross-sectional view illustrating a semiconductor power module according to Embodiment 5, when mounted on a water jacket.

FIG. 5 is a cross-sectional view illustrating a semiconductor power module according to Embodiment 5, when mounted on a water jacket. In FIG. 5, a heat sink 1 has a first step portion 16, a second step portion 17, and a third step portion 18 in the side-surface portion thereof. The second step portion 17 is formed more inside in the radial direction of the heat sink 1 than the first step portion 16 is; the third step portion 18 is formed more inside in the radial direction of the heat sink 1 than the second step portion 17 is.

The first step portion 16 is embedded in the transfer resin 5; the second step portion 17 and the third step portion 18 are exposed from the rear side of the transfer resin 5. The transfer resin 5 is made to mold around the first step portion 16 of the heat sink 1, so that the adhesiveness between the transfer resin 5 and the heat sink 1 can be raised. Along with the step portion of the penetration hole 4*a*1 formed in the first case 4*a*, the third step portion 18 forms the groove portion 23 in which the ring-shaped packing 2 is mounted. The other configurations are the same as those of the semiconductor power module according to Embodiment 1.

Figure 6:
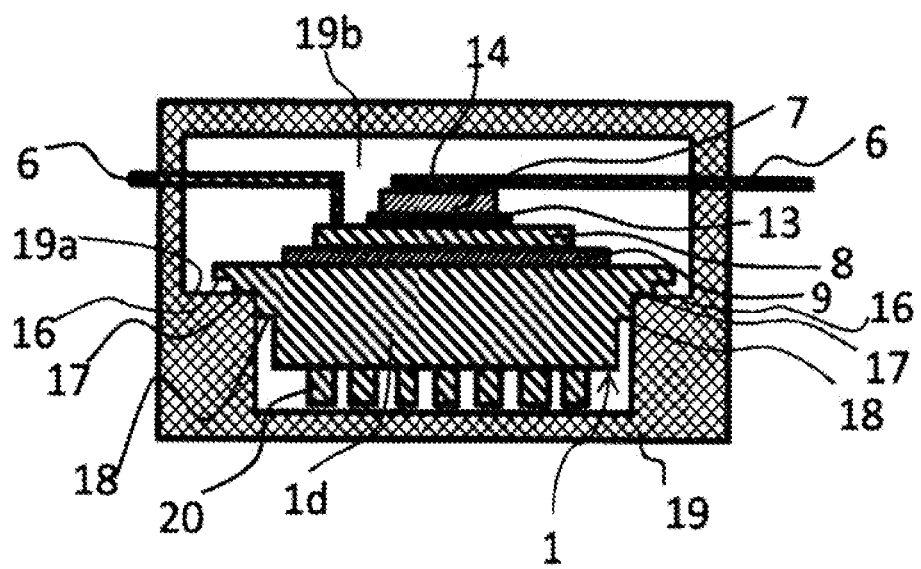
FIG. 6 is an explanatory view illustrating the semiconductor power module according to Embodiment 5 in a process at a production stage.

FIG. 6 is an explanatory view illustrating the semiconductor power module according to Embodiment 5 in a process at a production stage; FIG. 6 represents a process in which the semiconductor power module is molded with the transfer resin. As illustrated in FIG. 6, in a molding process in which the heat sink 1 is molded with the transfer resin 5, the second step portion 17 of the heat sink 1 is placed and abut on an inner step portion 19*a* of a molding die 19. As a result, when a space portion 19*b* of the molding die 19 is filled up with a liquefied transfer resin, the transfer resin is prevented from flowing to the vicinity of the protruding portion 1*d* of the heat sink 1 and the vicinity of the cooling fin 20.

In addition to an effect the same as that of the semiconductor power module according to Embodiment 1, the semiconductor power module according to Embodiment 5 demonstrates an effect that because the first step portion 16 improves the adhesiveness between the transfer resin 5 and the heat sink 1, the durability to a temperature cycle and the like is raised. Moreover, because the third step portion 18 is separated by a distance corresponding to the height thereof from the rear side, of the semiconductor power module 21, that is formed of the second step portion 17 and the transfer resin 5, coolant water can be prevented from invading into the boundary surface between the transfer resin 5 and the heat sink 1 from a sealing portion formed of the ring-shaped packing 2 inserted into the groove portion 23; as a result, prolongation of the life time of the semiconductor power module 21 can be realized.

Embodiment 6

Figure 7:
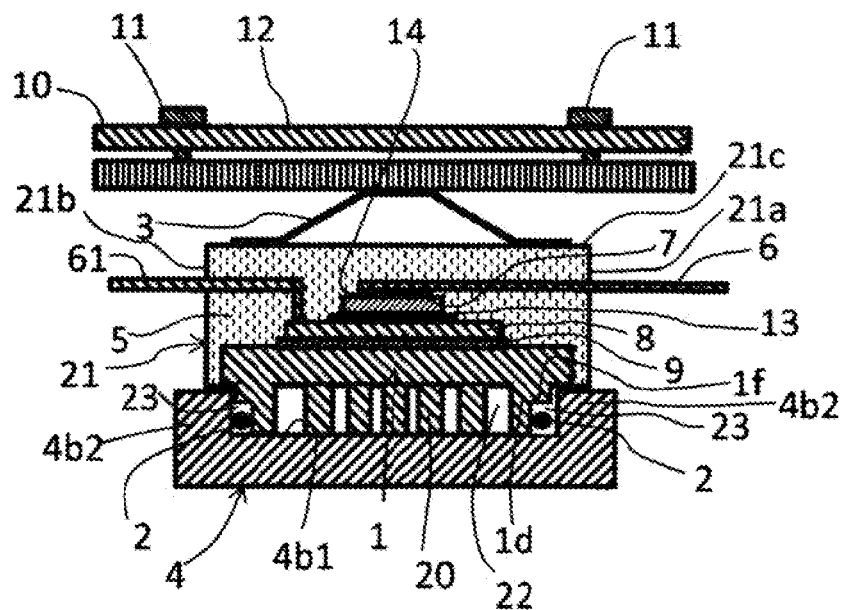
FIG. 7 is a cross-sectional view illustrating a semiconductor power module according to Embodiment 6, when mounted on a water jacket.

FIG. 7 is a cross-sectional view illustrating a semiconductor power module according to Embodiment 6, when mounted on a water jacket. In FIG. 7, the groove portion 23 in which the ring-shaped packing 2 is mounted is disposed at a position corresponding to the side portion of the cooling fin 20 of the heat sink 1. That is to say, a step portion if formed in the protruding portion 1*d* of the heat sink 1 is separated from the rear side of the transfer resin 5 toward the front-end portion of the protruding portion 1*d* and is disposed at the position corresponding to the side portion of the cooling fin 20. The case of the water jacket 4 has a side wall portion 4*b*2 that faces the side wall portion of the protruding portion 1*d* of the heat sink 1. The groove portion 23 in which the ring-shaped packing 2 is mounted is formed of the side wall portion 4*b*2 of the water jacket 4 and the side wall portion of the protruding portion 1*d* of the heat sink 1 and is disposed at the position corresponding to the side portion of the cooling fin 20. The other configurations are the same as those of the semiconductor power module according to Embodiment 1.

In addition to an effect the same as that of the semiconductor power module according to Embodiment 1, the semiconductor power module according to Embodiment 6 demonstrates an effect that because the ring-shaped packing 2 is situated at the position corresponding to the side portion of the cooling fin 20, downsizing of the heat sink 1 and, eventually, further downsizing of the semiconductor power module 21 become possible.

Embodiment 7

Figure 8:
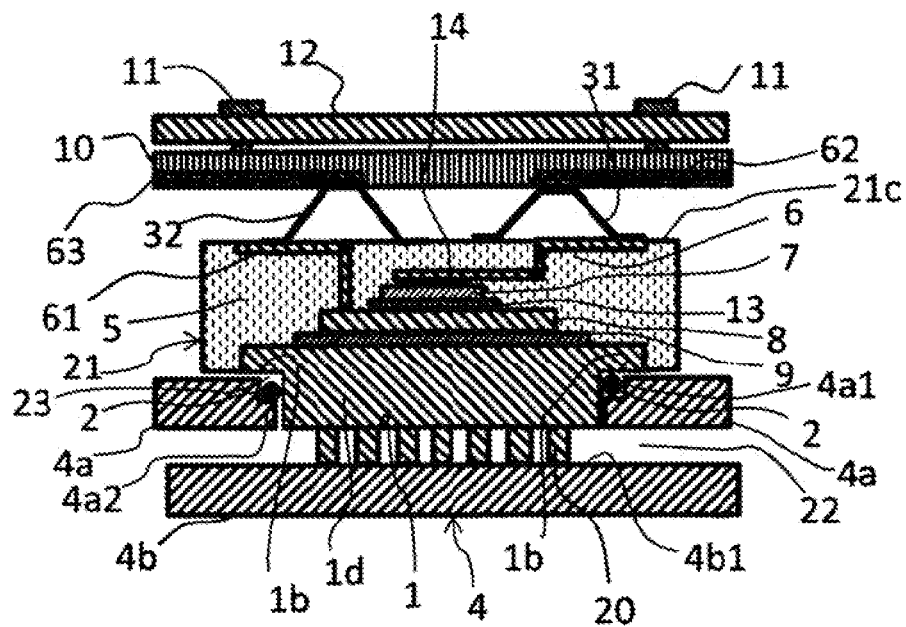
FIG. 8 is a cross-sectional view illustrating a semiconductor power module according to Embodiment 7, when mounted on a water jacket.

FIG. 8 is a cross-sectional view illustrating a semiconductor power module according to Embodiment 7, when mounted on a water jacket. In FIG. 8, the second electrode 6 and the bus bar 61 are embedded in the transfer resin 5 in such a way that the respective front sides thereof are exposed from the front side 21c of the semiconductor power module 21. Wiring of conductive members 62 and 63 are performed while they are embedded in the supporting member 10 in such a way that respective parts thereof are exposed from the supporting member 10.

A metal spring member 31 makes contact with the exposed portion of the second electrode 6 and the exposed portion of the conductive member 62 and forms part of an energization path. A metal spring member 32 makes contact with the exposed portion of the bus bar 61 and the exposed portion of the conductive member 63 and forms part of an energization path. Each of the spring members 31 and 32 has a function of pressing the semiconductor power module 21 to the water jacket 4. Each of the spring members 31 and 32 may be any one of a leaf spring, a plate spring, and a spring-shaped spring. The supporting member 10 is formed of a molding resin. The other configurations are the same as those of the semiconductor power module according to Embodiment 1.

In addition to an effect the same as that of the semiconductor power module according to Embodiment 1, the semiconductor power module according to Embodiment 7 makes it possible that because the second electrode 6 of the semiconductor power module 21 and the bus bar 61 are pulled out from the front side 21c of the semiconductor power module 21, the plane-shaped area of the semiconductor power module 21 decreases, in comparison with the conventional structure in which the second electrode is pulled out from the side-surface portion, and hence the semiconductor power module 21 is further downsized.

Embodiment 8

In a semiconductor power module according to Embodiment 8, a spring member is disposed between a case of the water jacket and a supporting member for supporting the control board; the transfer resin abuts on the supporting member; the spring member presses the front-end portion of the cooling fin to the inner wall surface of the flow path through the intermediary of the supporting member.

Figure 9:
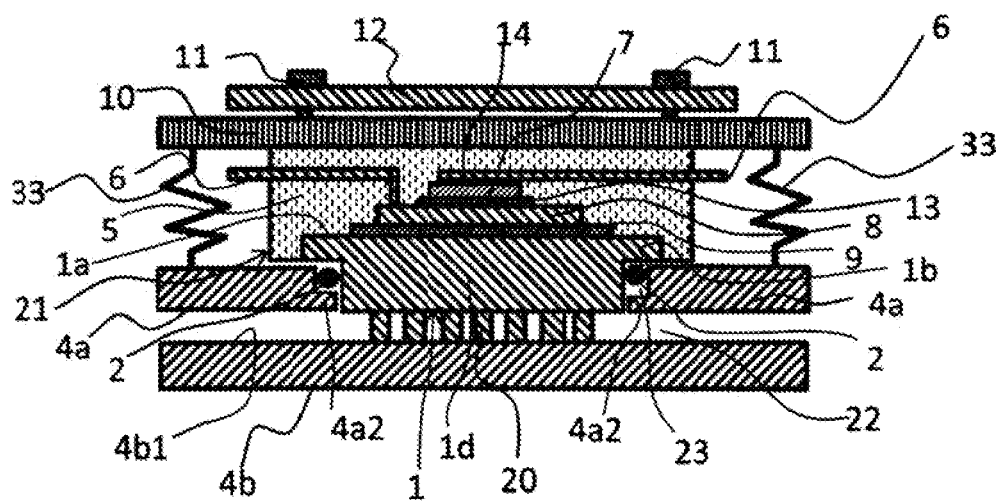
FIG. 9 is a cross-sectional view illustrating a semiconductor power module according to Embodiment 8, when mounted on a water jacket.

FIG. 9 is a cross-sectional view illustrating a semiconductor power module according to Embodiment 8, when mounted on a water jacket. In FIG. 9, a spring member 33 formed of a tension spring is mounted between a supporting member 10 and the first case 4a of the water jacket 4. As the spring member 33, for example, a sprig-shaped tension spring is utilized. The front side of the semiconductor power module 21 abuts on the supporting member 10.

The semiconductor power module 21 and the water jacket 4 are urged by a tension load of the spring member 33 in respective directions through which they approach each other. Accordingly, the front-end portion of the cooling fin 20 of the heat sink 1 is pressed by the tension load of the spring member 33 to the inner wall surface 4b1 of the flow path 22 of the water jacket 4. The other configurations are the same as those of the semiconductor power module according to Embodiment 1.

The semiconductor power module according to Embodiment 8 can demonstrate an effect the same as that of the semiconductor power module according to Embodiment 1.

Embodiment 9

In a semiconductor power module according to Embodiment 9, a water jacket has a first case and a second case that can move relatively to each other; a flow path is provided between the first case and the second case; a spring member is disposed between the first case and the second case of the water jacket; a penetration hole is provided in the first case; the first case is fixed to a supporting member for supporting the control board; a transfer resin abuts on the supporting member; a spring member presses the front-end portion of the cooling fin to the inner wall surface of the flow path, through the intermediary of the second case.

Figure 10:
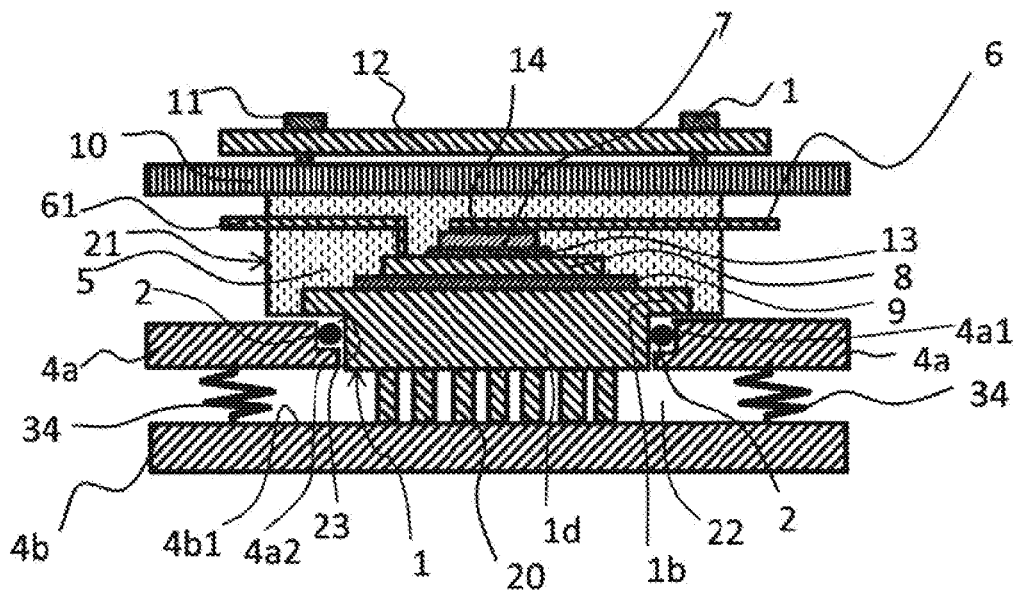
FIG. 10 is a cross-sectional view illustrating a semiconductor power module according to Embodiment 9, when mounted on a water jacket.

FIG. 10 is a cross-sectional view illustrating a semiconductor power module according to Embodiment 9, when mounted on a water jacket. In FIG. 10, a spring member 34 formed of a tension spring is mounted between the first case 4a and the second case 4b in the water jacket 4. As the spring member 34, for example, a sprig-shaped tension spring is utilized. The front side of the semiconductor power module 21 abuts on the supporting member 10.

The semiconductor power module 21 and the second case 4b of the water jacket 4 are urged by a tension load of the spring member 34 in respective directions through which they approach each other. Accordingly, the front-end portion of the cooling fin 20 of the heat sink 1 is pressed by the tension load of the spring member 33 to the inner wall surface 4b1 of the flow path 22 of the water jacket 4. The other configurations are the same as those of the semiconductor power module according to Embodiment 1.

The semiconductor power module according to Embodiment 9 can demonstrate an effect the same as that of the semiconductor power module according to Embodiment 1.

Although the present disclosure is described above in terms of various exemplary embodiments, it should be understood that the various features, aspects and functions described in one or more of the individual embodiments are not limited in their applicability to the particular embodiment with which they are described, but instead can be applied, alone or in various combinations to one or more of the embodiments. Therefore, an infinite number of unexemplified variant examples are conceivable within the range of the technology disclosed in the present application. For example, there are included the case where at least one constituent element is modified, added, or omitted and the case where at least one constituent element is extracted and then combined with constituent elements of other embodiments.

What is claimed is:
1. A semiconductor power module that is mounted on a front side of a case of a jacket provided with a flow path through which cooling fluid flows and that is cooled by the cooling fluid, the semiconductor power module comprising:
   a semiconductor device forming a switching circuit;
   a first electrode to which the semiconductor device is die-bonded;
   a second electrode connected with the semiconductor device;
   a heat sink whose front side is bonded to the second electrode through the intermediary of an insulating material; and
   a transfer resin in which the semiconductor device, the first electrode, the second electrode, and the insulating material are embedded,
   wherein the heat sink has a protruding portion that is exposed from and protrudes from part of a rear side of the transfer resin and a cooling fin fixed to an endface portion of the protruding portion,
   wherein the case of the jacket has a penetration hole that penetrates a portion thereof between the flow path and the front side of said case, wherein when the semiconductor power module is mounted on the case of the jacket, the protruding portion of the heat sink is inserted into the penetration hole in the case, and the endface portion of the protruding portion and the cooling fin are exposed in the flow path, wherein the front-end portion of the cooling fin abuts on the inner wall surface of the flow path, wherein a ring-shaped packing is inserted into a groove portion formed between a side wall portion of the protruding portion of the heat sink and an inner wall portion of the penetration hole of the jacket or a side wall portion of the case, wherein the inner wall portion of the penetration hole or the side wall portion of the case and the side wall portion of the protruding portion compress the ring-shaped packing in a radial direction of the ring-shaped packing, and wherein elastic force of a spring member presses the front-end portion of the cooling fin to the inner wall surface of the flow path.

2. The semiconductor power module according to claim 1, wherein the groove portion includes a step portion provided in the heat sink and a step portion formed in the inner wall portion of the penetration hole provided in the case of the jacket.

3. The semiconductor power module according to claim 1, wherein the groove portion is configured with a U-shaped groove formed in the side wall portion of the protruding portion.

4. The semiconductor power module according to claim 1, wherein a groove portion in which a ring-shaped packing is mounted includes a slant surface portion formed in the protruding portion of the heat sink and the inner wall portion of the penetration hole provided in the case of the jacket.

5. The semiconductor power module according to claim 1,
wherein the heat sink has a concavity portion that is dented from the front side thereof, and
wherein the second electrode is bonded to a bottom-surface portion of the concavity portion through the intermediary of the insulating material.

6. The semiconductor power module according to claim 1, wherein the front-end portion of the cooling fin abuts on the inner wall surface of the flow path, so that a height-direction position of the semiconductor power module is determined.

7. The semiconductor power module according to claim 1, wherein the heat sink has a first step portion embedded in the transfer resin, a second step portion formed in such a way as to be situated at a plane that is one and the same as the rear side of the transfer resin, and a third step portion that forms the groove portion in which the ring-shaped packing is mounted.

8. The semiconductor power module according to claim 1, wherein the groove portion in which the ring-shaped packing is mounted is provided at a position corresponding to a side portion of the cooling fin.

9. The semiconductor power module according to claim 1, wherein the ring-shaped packing is formed in such a way that the cross section thereof is round-shaped.

10. The semiconductor power module according to claim 1, wherein the ring-shaped packing is formed in such a way that the cross section thereof is H-shaped.

11. The semiconductor power module according to claim 1,
wherein the spring member is disposed between a front side of the transfer resin and a supporting member that supports a control board on which a control circuit for controlling the switching circuit is mounted, and
wherein the supporting member and the jacket are directly or indirectly fixed to each other.

12. The semiconductor power module according to claim 11,
wherein each of the first electrode and a bus bar connected with the second electrode has an exposed portion that is exposed on the front side of the transfer resin,
wherein the supporting member has two or more conductive members, at least respective parts of which are exposed therefrom,
wherein the spring member includes two or more metal spring members,
wherein one of the metal spring members makes contact with the exposed portion of the first electrode and one of the two or more conductive members so as to be electrically connected therewith, and
wherein the other one of the metal spring members makes contact with the exposed portion of the bus bar and one of the two or more conductive members so as to be electrically connected therewith.

13. The semiconductor power module according to claim 1,
wherein the spring member is disposed between the case of the jacket and a supporting member that supports a control board on which a control circuit for controlling the switching circuit is mounted,
wherein the transfer resin abuts on the supporting member, and
wherein the spring member presses the front-end portion of the cooling fin to the inner wall surface of the flow path, through the intermediary of the supporting member.

14. The semiconductor power module according to claim 1,
wherein the jacket has a first case and a second case that can move relatively to each other,
wherein the flow path is provided between the first case and the second case,
wherein the spring member is disposed between the first case and the second case of the water jacket,
wherein the penetration hole is provided in the first case,
wherein the first case is fixed to a supporting member for supporting a control board,
wherein the transfer resin abuts on the supporting member, and
wherein the spring member presses the front-end portion of the cooling fin to the inner wall surface of the flow path, through the intermediary of the second case.

15. The semiconductor power module according to claim 2, wherein the front-end portion of the cooling fin abuts on the inner wall surface of the flow path, so that a height-direction position of the semiconductor power module is determined.

16. The semiconductor power module according to claim 3, wherein the front-end portion of the cooling fin abuts on the inner wall surface of the flow path, so that a height-direction position of the semiconductor power module is determined.

17. The semiconductor power module according to claim 4, wherein the front-end portion of the cooling fin abuts on the inner wall surface of the flow path, so that a height-direction position of the semiconductor power module is determined.

18. The semiconductor power module according to claim 5, wherein the front-end portion of the cooling fin abuts on the inner wall surface of the flow path, so that a height-direction position of the semiconductor power module is determined.

\* \* \* \* \*